United States Patent [19]

Morisaki et al.

[11] Patent Number: 5,089,691
[45] Date of Patent: Feb. 18, 1992

[54] IMAGE RECORDING APPARATUS HAVING BAR CODE READER FOR READING BAR CODE ATTACHED TO LEADING END OF MICROCAPSULE SHEET

[75] Inventors: Hiroshi Morisaki, Nishikasugai; Tokunori Kato, Ichinomiya, both of Japan

[73] Assignee: Brother Kogyo Kabushiki Kaisha, Japan

[21] Appl. No.: 539,194

[22] Filed: Jun. 18, 1990

[30] Foreign Application Priority Data

Jul. 11, 1989 [JP] Japan .................. 1-179797
Aug. 11, 1989 [JP] Japan .................. 1-95158

[51] Int. Cl.⁵ .................. G06F 15/20
[52] U.S. Cl. .................. 235/375; 235/472; 355/38; 354/21
[58] Field of Search .......... 235/375, 472; 360/2; 355/38, 41; 354/21

[56] References Cited

U.S. PATENT DOCUMENTS

| | | | |
|---|---|---|---|
| 4,554,591 | 1/1985 | Kee | 360/2 |
| 4,675,531 | 6/1987 | Clark et al. | 235/472 |
| 4,812,862 | 3/1989 | Fujino | 354/21 |
| 4,866,467 | 9/1989 | Taniguchi | 354/21 |
| 4,920,376 | 4/1990 | Yamamoto | 355/38 |
| 4,937,617 | 6/1990 | Kito | 355/41 |

*Primary Examiner*—Harold Pitts
*Attorney, Agent, or Firm*—Oliff & Berridge

[57] ABSTRACT

An image recording apparatus having means for changing an exposure condition in accordance with a change in photosensitivity of an applied photosensitive recording medium. The recording medium has a leading end portion provided with a bar code indicative of the photosensitivity. Upon sensing the data, control means controls the exposure condition by controlling light irradiation amount from the light source and/or filter insertion amount relative to an optical path. The bar code may be erroneously read by a bar code reader, or if the bar code is not attached to the recording medium, correct data is read out from a memory means. Alternatively, a standardized data is loaded into the memory means, and the latter data is read out for the control to the exposure condition.

15 Claims, 4 Drawing Sheets

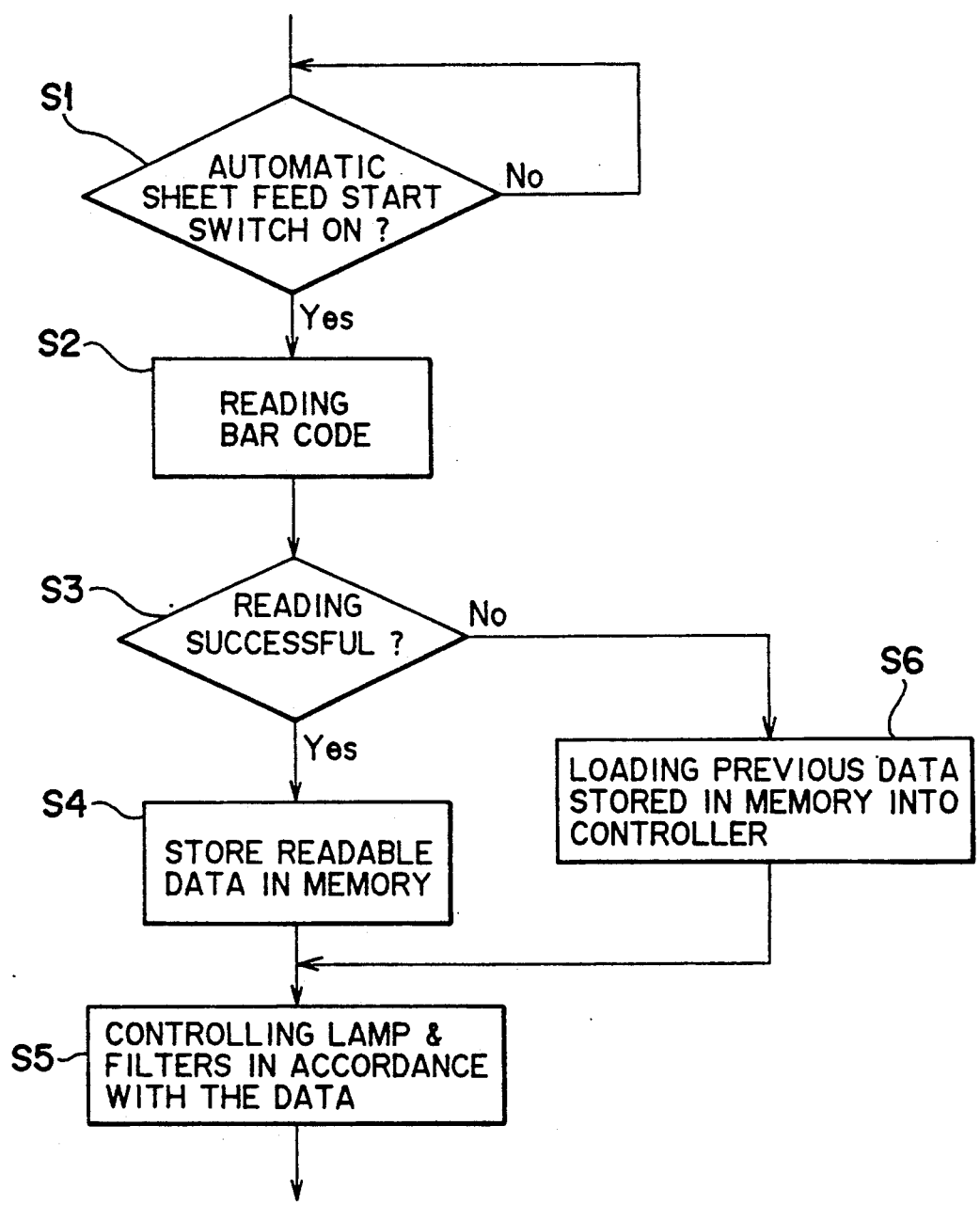

IMAGE RECORDING APPARATUS HAVING BAR CODE READER FOR READING BAR CODE ATTACHED TO LEADING END OF MICROCAPSULE SHEET

BACKGROUND OF THE INVENTION

The present invention relates to an image recording apparatus, and more particularly to a type thereof in which an exposure condition is controllable in accordance with characteristic of a photosensitive recording medium applied.

One conventional image recording apparatus is shown in FIG. 1. However, it should be noted that the apparatus shown in FIG. 1 is also available in the present invention.

The recording apparatus 1 pertains to a full color copying machine and employs a photosensitive sheet medium including a microcapsule sheet and a developer sheet those described in U.S. Pat. No. 4,399,209. At an upper portion of the apparatus 1, a transparent original support glass 2 for mounting an original 4 thereon and a cover 3 for selectively covering the support glass 2 are laterally movably provided. On the original support glass 2, the original 4 is mounted with its imaging surface facing downwardly. At a position below the original support glass 2, there is provided a light source 5 including a halogen lamp 5a and reflection members 5b and 5c for irradiating a line-light to the original 2 through the original support glass 2 by way of a slit formed in a pivotable upper wall 1b of a frame body 1a. The line-light passes through the original support glass 2 and is reflected at a surface of the original 4. The halogen lamp 5a extends in a direction perpendicular to the moving direction of the original support glass 2. During light emission from the light source 5, the original support glass 2 is laterally moved so that the overall area of the original 4 is subjected to light irradiation line by line basis.

At a central portion of the copying machine 1, an exposure stand 10 is disposed. Further, between the light source 5 and the exposure stand 10, there is provided an optical system including a color tone controlling filter unit 8, a light condensing lens unit 7 and a pair of reflection mirrors 9a and 9b. The color tone controlling filter unit 8 and the lens unit 7 are attached to an attachment piece 34, whereas the pair of reflection mirrors 9a, 9b are secured to an attachment plate 9c which is movable for controlling optical path length and focal length relative to a photosensitive recording medium such as a microcapsule sheet 11 on the exposure stand 10. Therefore, light from the light source 5a passing through the slit is reflected at the original 4, and the reflected light passes through the filter unit 8, the lens unit 7 and the reflection mirrors 9a, 9b, to thereby reach the exposure stand 10. In other words, generally J-shape light path is provided between the light source 5 and the exposure stand 10 so that the light direction can be substantially inverted. Consequently, at the exposure stand 10, a latent image is formed on the microcapsule sheet 11 corresponding to an image of the original 4. More specifically, light exposed microcapsules are photo-cured, whereas unexposed microcapsules are not hardened. Incidentally, a light shielding cover member 1c is provided for preventing the light from the original from applying on the microcapsule sheet 11 running at a position in the vicinity of the optical unit. In other words, the light can only be passed through a slit 1d of the shielding wall 1c for permitting light exposure to the sheet 11 at the exposure stand 10.

At an upper inner space of the copying machine 1, a microcapsule sheet cartridge 12 is detachably provided, and a tape-up shaft 15 is rotatably provided. In the sheet cartridge 12, stored is the rolled microcapsule sheet 11 carrying microcapsules which encapsulate therein chromogenic material for color copying. A cartridge shaft 12a is provided for winding the microcapsule sheet 11 thereover. A plurality of feed rollers 14a, 14b are rotatably provided so as to feed the elongated microcapsule sheet 11 from the sheet cartridge 12. The thus pulled-out microcapsule sheet 11 passes through the exposure stand 10 where the sheet 11 is exposed to light in order to form a latent image thereon. The sheet 11 is taken up over the take-up shaft 15.

Below the exposure stand 10, a developer sheet cassette 17 is detachably provided which stores a stack of cut developer sheets 16. Further, a sheet feed mechanism 18 such as a suction foot is provided for feeding each one of the developer sheet 16. For the sheet further delivery, a feed roller 19a and a pinch roller 19b and a guide plate 19f are provided. At a downstream side of these rollers 19a and 19b, a developer sheet rollers 19c, 19d and a resist gate 19e are provided so as to align a leading edge of the developer sheet 16 in order to feed the developer sheet 16 to a pressure developing unit 13 with its correct orientation. Incidentally, instead of the suction foot 18, a drive sector roller (not shown) is also available.

Further, the pressure developing unit 13 having a small diameter roller 13a and a back-up roller 13b is provided between the exposure stand 10 and the tape-up shaft 15. The light exposed portion of the microcapsule sheet 11 and the developer sheet 16 delivered from the cassette 17 are in close contact with each other and these are pressed together by the rollers 13a, 13b. Consequently, non-exposed microcapsules are ruptured by the pressure for causing chromogenic reaction between a chromogenic material in the microcapsules and the developer materials on the developer sheet 16, and as a result, a colored visible image corresponding to the latent image is formed on the developer sheet 16.

Further, at a downstream side of the pressure developing unit 13, two sheet passages are provided for directing the microcapsule sheet 11 toward the take-up shaft 15 and for directing the developer sheet 16 to a thermal fixing unit 20. For this, a pair of feed rollers 14c are provided at exit side of the pressure developing unit 13, and a separation roller 14d is provided at a downstream side of the feed rollers 14c for separating the microcapsule sheet 11 from the developer sheet 16. A meandering travel control roller 14e is movably provided between the separation roller 14e and the take-up shaft 15. Furthermore, at downstream side of the separation roller 14d, the sheet heating device 20 is provided for thermally fixing an output image on the developer sheet 16. At downstream side of the sheet heating device 20, a sheet tray 21 is provided for receiving the developer sheet carrying the final output image.

Upon manipulation of a start button (not shown), the original support glass 2 is moved to one direction (rightwardly in FIG. 1), so that a left edge of the original is brought into confrontation with the halogen lamp 5a, and thereafter, the halogen lamp 5a is turned on. The original support glass 2 is then moved to opposite direction (leftwardly in FIG. 1) during which the original 4 is successively subjected to a line-light exposure.

At the same time, the microcapsule sheet 11 is moved toward the take-up shaft 15 at the speed equal to the moving speed of the original support glass 2. Therefore, a latent image corresponding to the original image is successively formed on the microcapsule sheet 11 when it travels over the exposure stand 10. On the other hand, each one of the developer sheet 16 is delivered from the sheet cassette 17 to the pressure developing unit 13 in synchronism with the every leftward movement of the original support glass 2. The latent image portion of the microcapsule sheet 11 and the developer sheet 16 are pressed together at the pressure developing unit 13, so that a colored visible image is formed on the developer sheet 16. Thereafter, the developer sheet 16 is introduced into the sheet heating device or the thermal fixing unit 20 by means of the feed rollers 14c so as to fix the color image on the sheet 16, and is then discharged onto the discharge tray 21. On the other hand, the microcapsule sheet 11 passes through the separation roller 14d, and the meandering travel controlling roller 14e and is wound over the take-up shaft 15.

SUMMARY OF THE INVENTION

Generally, in a conventional image recording apparatus, a machine readable data or an indication member indicating a characteristic of a photosensitive recording sheet 11 is provided at a leading end portion thereof. The indication member may be a bar code which is indicative of a photosensitivity of the sheet 11. And the copying apparatus is provided with a reading unit for reading the bar code. Further, in order to change an exposure condition in accordance with the change in the photosensitivity of the installed rolled microcapsule sheet 11, light irradiation amount of the halogen lamp 5a can be changed, and further, insertion amount of each of red, green and blue filters of the filter unit 7 relative to the optical path is controllable. For this, filter driving mechanism including a stepper motors and a gear transmission unit is provided for controlling the insertion amount of each one of the filters relative to the optical path.

According to this arrangement, if the bar code reader fails to read the bar code, the rolled photosensitive sheet 11 must be again subjected to bar code reading. In this case, a part of the microcapsule sheet 11 has already been wound over the take-up shaft 15, and therefore, such part must again rewound over the cartridge shaft 12a for again starting the bar code reading. Such work is troublesome for an operator. Further, due to several reasons, there may be occasions that it would be almost impossible to perform the bar code reading, for example, in a case where a photosensitivity level printed on the bar code exceeds a predetermined level, or unclear printing of the bar code, contamination to the bar code, undue formatting to the bar code, and no attachment of the bar code to the leading end portion of the microcapsule sheet. Therefore, image recording or copying operation cannot be started due to failure of the bar code reading.

Moreover, if malfunction occurs, such as sheet jamming in the copying apparatus, the microcapsule sheet must be cut. In such case, since the cut leading end of the microcapsule sheet does not have the bar code label, it is impossible to achieve the bar code reading, and therefore, it would be impossible to re-start the copying operation.

If the sensitivity level exceeds the predetermined level, reading error may be notified to the operator by means of a display means. Then, the operator must again set the rolled microcapsule sheet 11 for the bar code reading. Such works must repeatedly be made until the bar code is correctly read by the bar code reader. Even by such repeated works, the bar code reading cannot be made if the bar code per se has improper conditions, such as contamination, unclear bar code printing, undue formatting, etc. Further, erroneous bar code reading may also occur in the bar code reader, which in turn provides erroneous exposure conditions.

It is therefore, an object of the present invention to overcome the above described drawbacks and disadvantages, and to provide an improved image recording apparatus having an improved means for controlling a copying condition regardless of the undue reading to a characteristic of the applied photosensitive sheet medium.

Another object of the invention is to provide such improved image recording apparatus capable of avoiding repeated trials of reading to the characteristic of the applied photosensitive sheet medium.

Still another object of the invention is to provide an improved image recording apparatus capable of providing a proper exposure condition despite the fact that reading to the photosensitivity of the microcapsule sheet is erroneously made, and capable of avoiding undue overconsumption of the sheet.

These and other objects of the invention will be attained by providing an image recording apparatus for recording an image on an image recording medium, the image recording medium having a leading edge portion provided with a machine readable data inherent to the image recording medium, the apparatus comprising an exposure unit comprising a light source, a plurality of filters, an exposure portion, means for changing light irradiation amount from the light source, and means for changing insertion amount of filters of the filter unit with respect to an optical path extending from the light source to the exposure portion. The apparatus also comprises means for reading the machine readable data, memory means for storing therein a correct machine readable data, and control means connected between the reading means and the memory means for judging whether or not the reading means fails to read the correct machine readable data, and for controlling the exposure unit in accordance with the correct machine readable data stored in the memory means.

In one embodiment of this invention, after installing a new photosensitive recording medium and if the reading means fails to read the machine readable data or if the reading means cannot read the data inherent to the new medium, a machine readable data already read at the time of previous installation of a previous photosensitive recording medium and already stored in the memory means is read out for the exposure control.

In another embodiment of this invention, after installing a new photosensitive recording medium, and if the reading means fails to read the machine readable data or if the reading means reads abnormal data, the control means sends a standardized data as a correct data to the memory means instead of the abnormal data. The standardized data stored in the memory means is read out for the exposure control.

BRIEF DESCRIPTION OF THE DRAWINGS

In the drawings;

FIG. 3 is a flow chart for description of the control according to the first embodiment of this invention;

DETAILED DESCRIPTION OF THE PREFERRED EMBODIMENTS

Figure 1:
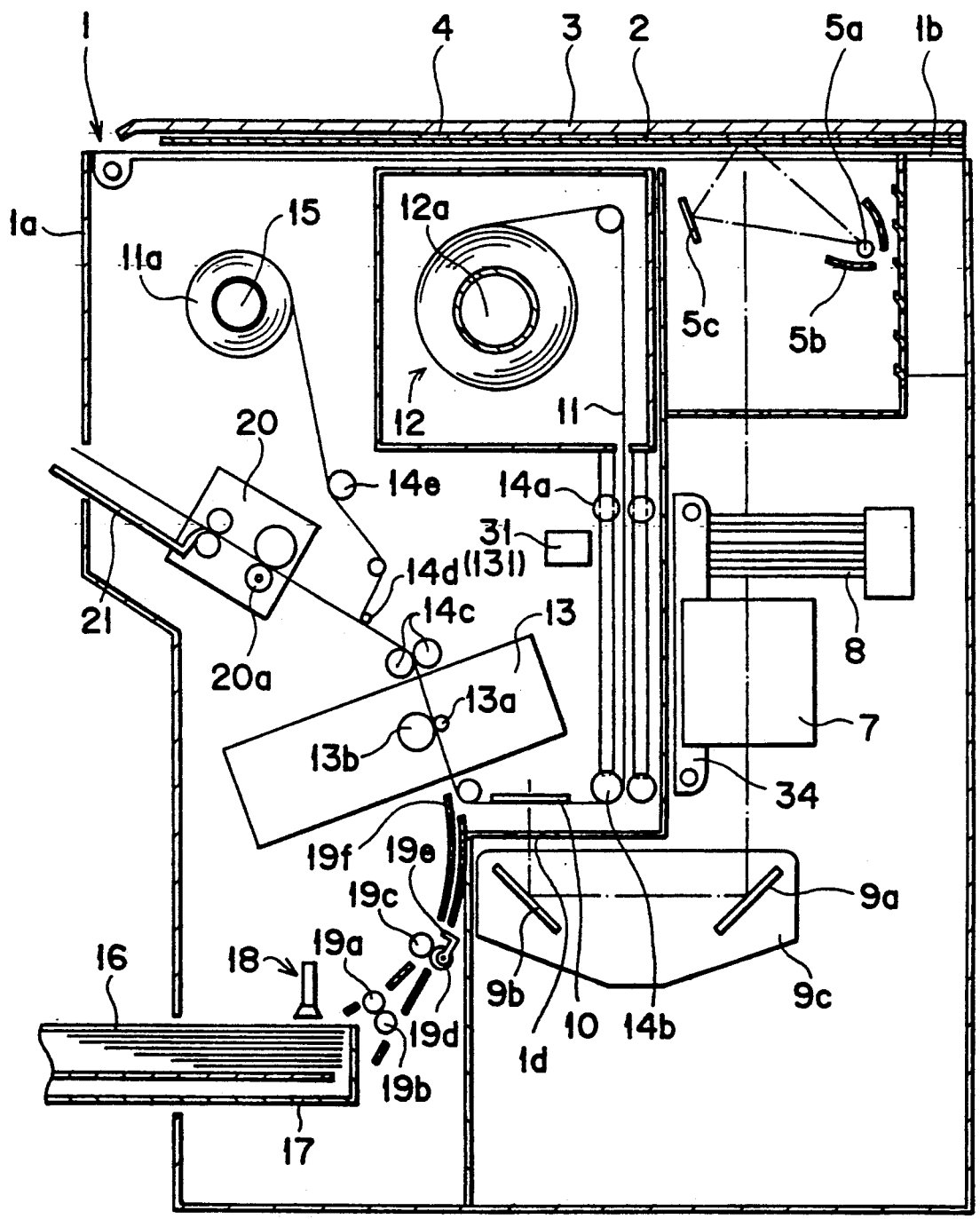
FIG. 1 is a schematic cross-sectional view showing an image recording apparatus provided with a copying condition controlling means according to the present invention.

Main units such as an exposure unit, pressure developing unit, and thermal fixing unit used in an image recording apparatus according to the present invention are the same as those of the conventional recording apparatus. According to a first embodiment of this invention, a bar code reading unit 31 is provided for reading a bar code attached to a leading end portion or a leader portion of an elongated microcapsule sheet 11. The bar code reading unit 31 is provided at a position between feed rollers 14a and 14b as shown in FIG. 1.

Figure 2:
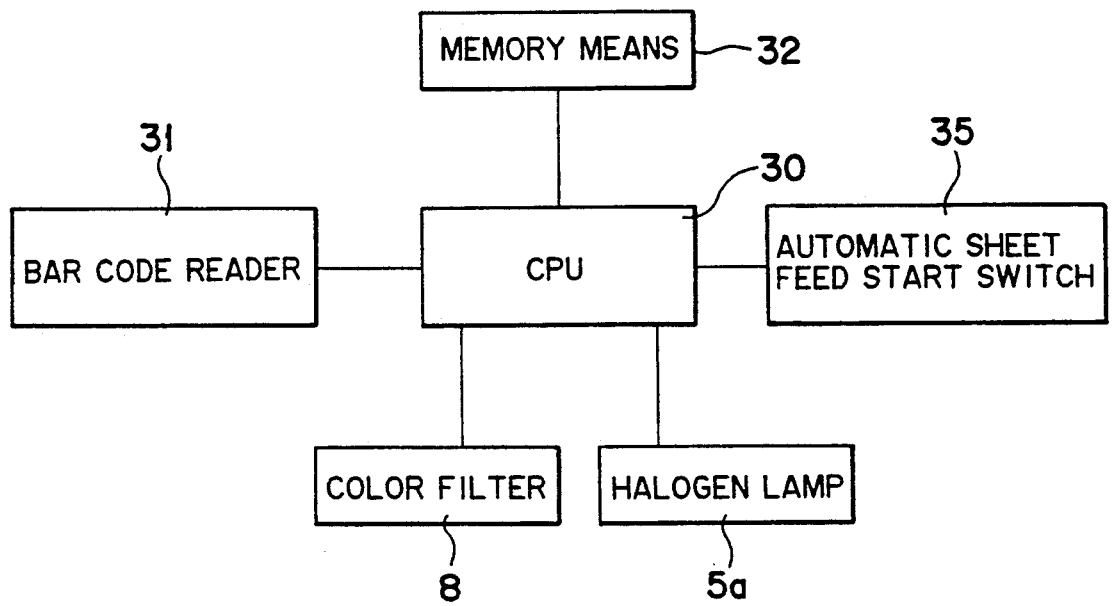
FIG. 2 is a schematic diagram showing a control circuit for controlling a copying condition according to a first embodiment of this invention.

As shown in FIG. 2, a control means or CPU 30 is provided to which the bar code reading unit 31 is connected. Further, an automatic sheet feeding switch 35 is also connected to the CPU 30. Moreover, a halogen lamp 5a and a filter unit 8 are also connected to the CPU through a light source driving circuit (not shown) and filter driver circuits (not shown). Moreover, a memory means 32 is connected to the CPU 30. In the memory means 32, a machine readable data correctly read by the bar code reading unit 31 at the time of the precedent assembly of the rolled microcapsule sheet 11 is stored through the CPU 30. Further, in the following or next assembly of the microcapsule sheet 11 along the sheet path, if the bar code reading unit 31 fails to read the bar code, the machine readable data or the bar code data successfully read and stored in the memory means 32 at the precedent assembly is inputted into the CPU 30. Therefore, the controls to the color filters of the filter unit 8 and the halogen lamp 5a are achievable by the precedent data.

More specifically, in FIG. 3, after a new rolled microcapsule cartridge 12 is assembled in the copying apparatus 1, the automatic sheet feed start switch 35 is depressed. In step S1, CPU 30 determines whether the automatic sheet feed start switch 35 is rendered ON. Accordingly, the microcapsule sheet 11 is pulled out of a cartridge casing by the feed roller 14a. In step S2, the bar code attached at the leader portion is read by the bar code reading unit 31, and in step S3, a determination is made as to whether or not the bar code reading is successfully made. If Yes, in step S4 the read bar code data is stored in the memory means 32, and in Step S5 CPU controls the light source 5a and the filter unit 8 through the light source driving circuit (not shown) and filter driver circuits (not shown) in accordance with the bar code data. Therefore, optimum exposure condition can be provided with respect to the microcapsule sheet having one specific photosensitivity.

On the other hand, if malfunction occurs in the copying apparatus, the microcapsule sheet 11 must be cut for maintenance or inspection to the apparatus. In this case, several portion of the microcapsule sheet 11 has already been wound over the take-up shaft, and remaining microcapsule sheet 11 is still positioned in the sheet cartridge 12. In this case, the cut leading edge of the microcapsule sheet 11 does not apparently have the bar code, since the bar code is positioned at the most inner portion of a sheet roll 11a wound over the take-up shaft 15. In such a case, in the step S3, the bar code reading process is unsuccessful and the routine proceeds into step S6 where the data already stored in the memory means 32 in the step S4 is loaded on the CPU 30. Thereafter, the routine proceeds into the step S5 for controlling the light source 5a and/or the filter unit 8. Consequently, proper exposure condition can still be provided despite of the failure of the reading to the machine readable data.

In the first embodiment as described above, the machine readable data already correctly read in the precedent sheet installation and stored in the memory unit 32 is used as the machine readable data in the next reading step if the machine readable data has some any drawbacks, such as contamination, etc. In this case, the newly installed rolled microcapsule sheet 11 has a photosensitivity approximately the same as that in the precedent microcapsule sheet 11, since these sheets are manufactured in one production lot. Therefore, a proper exposure condition can still be provided in spite of unsuccessful reading to the machine readable data with respect to the newly installed microcapsule sheet. Further, as described above, even if no machine readable data is attached to the leading end portion of the microcapsule sheet, proper exposure condition can still be provided by reading out the already stored data with respect to the preceding installed microcapsule sheet.

Figure 4:
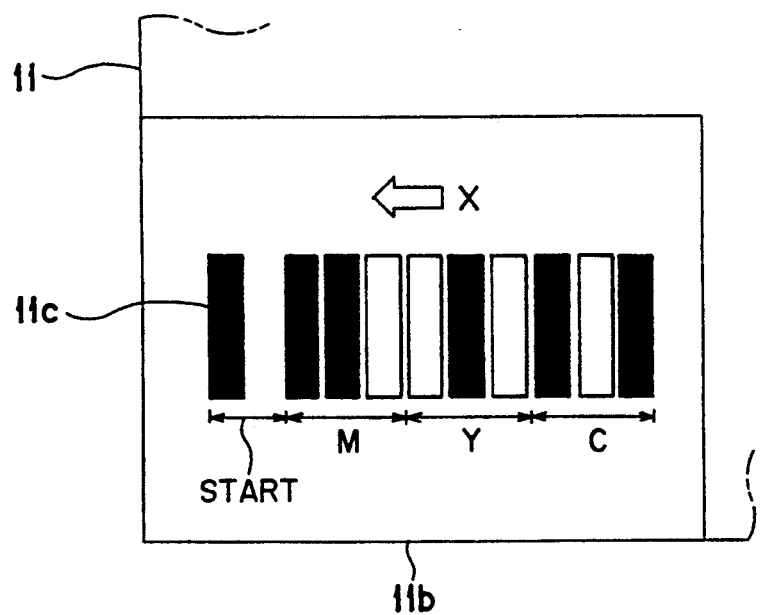
FIG. 4 is a plan view showing a leading end portion of a microcapsule sheet, which leading portion is provided with a machine readable data, i.e., a bar code label.

FIG. 4 shows one example of a bar code attached to the leader portion of the microcapsule sheet 11. The microcapsule sheet 11 has a leader portion 11b at a free leading end portion thereof. The leader portion 11b is formed of a white color resin material such as polyethylene terephthalate. On the leader portion 11b, a bar code label 11c is affixed which is indicative of a photosensitivity of the microcapsule sheet produced through one production lot. The bar code label 11c contains eleven black and white codes as shown in FIG. 4. One black or white code corresponds to "1" or "zero" as a one bit data. First two bits (first black code and subsequent white code) with respect to a running direction X of the sheet 11 function as a start bit so as to distinguish the code section from the color of the leader portion. Subsequent nine bits are divided into three bit groups with respect to magenta, yellow and cyan colors so as to indicate sensitivities with respect to these colors. In other words, with respect to each of the colors, $2^3$ (eight types) data can be contained, i.e., from 0 to 7 reference numerals can be indicated by the three codes. This kind of the bar code is also available in the first embodiment.

Here, according to the second embodiment of this invention, among these reference numerals, a standardized sensitivity is designated by the reference numeral "4", and photosensitivity level in each of the colors is represented by five stages by way of the reference numerals 2, 3, 4, 5 and 6. Incidentally, reference numerals 0, 1 and 7 are not used as far as the applied microcapsule sheet has available photo sensitivities.

Figure 5:
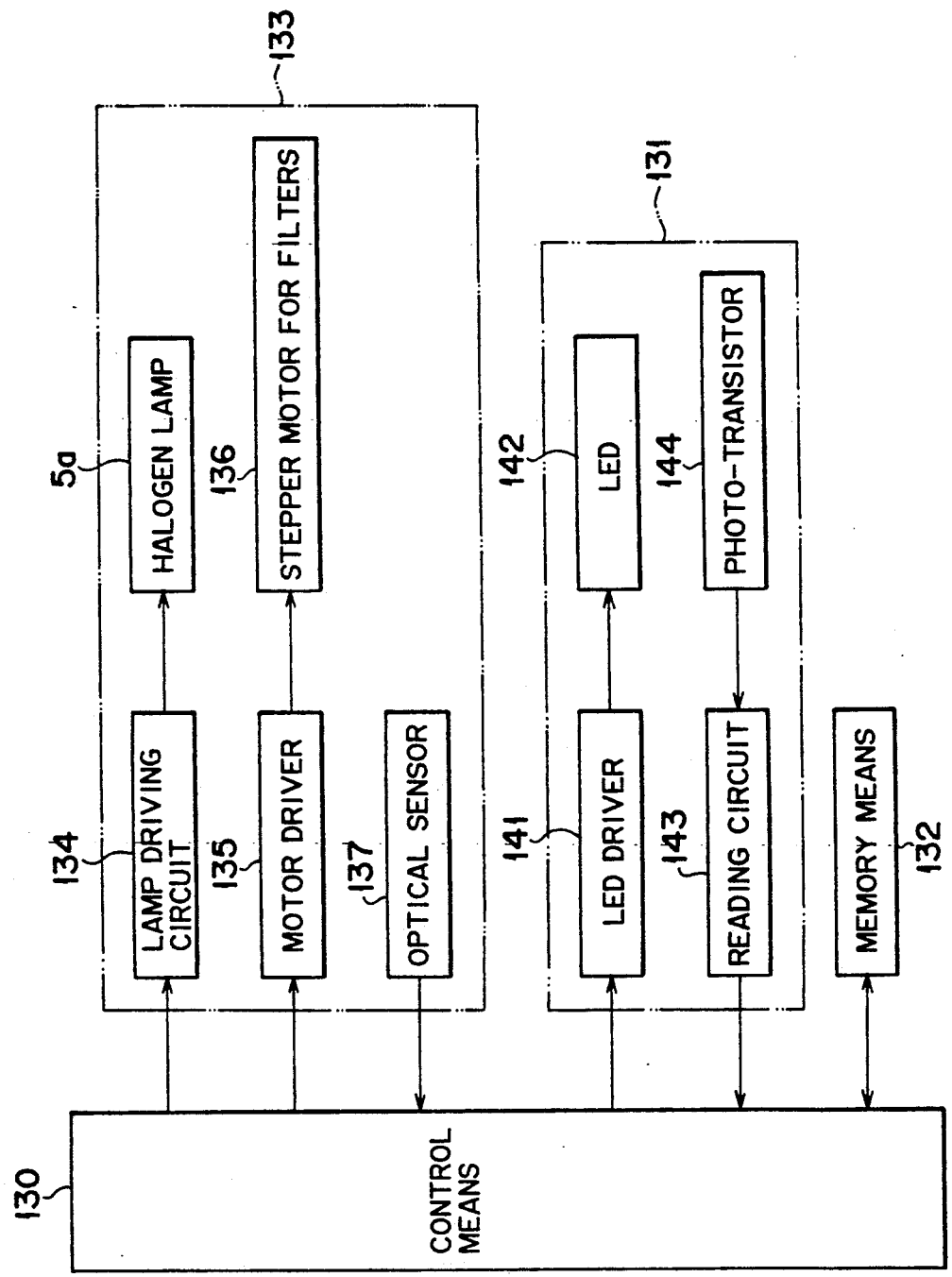
FIG. 5 is a schematic diagram showing an electrical connection for the control to the copying condition according to a second embodiment of this invention.

Next, an electrical circuit in the second embodiment will be described with reference to FIG. 5. A controller 130 is provided accommodating therein CPU, ROM and RAM for controlling overall operation of the copying machine. The controller 130 has an output terminal connected with a halogen lamp 5a through a lamp driving circuit 134. Further, a stepper motor 135 is connected to the controller 130 through a motor driver 135 for controlling insertion amount of the filters of the filter unit 8. The controller 130 has an input terminals connected to an optical sensor 137 which detects light irradiation amount of the light source 5a. The components 134 thru 137 constitute an exposure device 133 in combination with the light source 5a. Incidentally, this arrangement is also available in the first embodiment described above.

Further, a machine readable data reading unit 131 is provided by a LED driver 141, a light emitting diode (LED) 142, a reading circuit 143 and a photo-transistor 144. More specifically, the LED 142 is adapted to irradiate light onto the machine readable data, i.e., the bar code 11c, and the LED 142 is connected to an input terminal of the controller 130 through the LED driver 141. On the other hand, the photo-transistor 144 is adapted to read the bar code data upon detection of the reflected light from the bar code label 11c. The phototransistor 144 is connected to an input terminal of the controller 130 through the reading circuit 143. This arrangement is also available in the first embodiment.

Moreover, in the second embodiment, a readable/programmable memory means 132 is connected to the controller 130. The memory means 132 is made up of a non-volatile RAM whose stored contents are not erased even if it is disconnected from a power source.

In operation, LED 142 is turned ON by an instruction from the controller 130 in response to a start of the microcapsule sheet feeding. Therefore, the leader portion 11c is irradiated by the LED 142. Light reflected from the bar code label 11c is entered into the phototransistor 144 where each bit data of the bar code label 11c is acknowledged because of the intensity level of the reflected light. This reflection light intensity is inputted into the controller 130 as a reading data through the reading circuit 143.

The controller 130 makes judgments as to whether the read data read by the reading unit 132 are correct or not, and then, the controller 130 sends data to the memory means 132 to be stored therein. That is, after the detections of the first two bits, the subsequent three bits data are subjected to judgment as to whether or not these bits are within a range of 2 to 6. If so, the controller 130 determines that the read data is a correct data which correctly identifies the photosensitivity of the magenta color, and the controller sends an output signal to the memory unit 132 so that the correct data is stored therein. On the other hand, if the three bits data are outside the range, that is, if the read data is 0 or 1 or 7, the controller determines that the data reading has been erroneously made. Accordingly, the controller 130 does not send this erroneous data to the memory unit, but sends a standardized data "4" to the memory unit 132. The same is true with respect to the subsequent three codes representing the sensitivity of yellow, and final three codes representing the sensitivity of cyan. Therefore, even if reading error occurs, the memory means 132 stores almost correct data with respect to three colors with using the standardized data.

When a start button (not shown) of the copying machine button is depressed, after the installation of the microcapsule sheet in the machine and after reading to these data indicated in the bar code, the controller 130 controls the lamp driver circuit 134 so as to provide an optimum light irradiation amount from the light source 5a in accordance with the sensitivity data stored in the memory means 132. of each of the filters with respect to the optical path by controlling the filter stepper motors 136 in accordance with the stored sensitivity.

In the second embodiment as described above, even if the data on the bar code label 11c is erroneously read, the erroneously read data is substituted by the standardized data. Therefore, it is unnecessary to again perform the data reading operation. Further, even if the bar code label 11c per se contains insufficient code printing, or even if the leader portion 11b meanderingly travels through the bar code reading unit 131 to disable the correct bar code reading, the standardized data "4" is sent to the memory means 132 and the data is used for providing the satisfactory exposure condition. Accordingly, the installed microcapsule sheet 11 can still be used for the image recording operation.

In the second embodiment, several modifications can be made. For example, when reading error occurs to read the bar code data, several times of readings are repeated, and the standardized data is only used in a case where the reading error still occurs in the repeated reading operations. Further, a magnetic tape is used for making the machine readable data, and a magnetic tape reader is used for reading the data of the magnetic tape.

While the invention has been described in detail and with reference to specific embodiments thereof, it would be apparent to those skilled in the art that various changes and modifications can be made therein without departing from the spirit and scope of the invention.

What is claimed is:

1. An image recording apparatus for recording an image on an image recording medium, the image recording medium having a leading edge portion provided with a machine readable data inherent to the image recording medium, the apparatus comprising:

an exposure unit comprising a light source, a plurality of filters, an exposure portion, means for changing light irradiation amount from the light source, and means for changing insertion amount of filters of the filter unit with respect to an optical path extending from the light source to the exposure portion;

means for reading the machine readable data;

memory means for storing therein a correct machine readable data; and control means connected between the reading means and the memory means for judging whether or not the reading means fails to read the machine readable data, and for controlling the exposure unit in accordance with the correct machine readable data stored in the memory means.

2. The image recording apparatus as claimed in claim 1, wherein the control means comprises means for loading the correct machine readable data into the memory means, and means for reading from the memory means the correct machine readable data already stored in the memory means if the reading means fails to read a machine readable data on a subsequent image recording medium newly installed, the correct machine readable data being already stored in the memory means in a precedent installation of the image recording medium.

3. The image recording apparatus as claimed in claim 2, wherein the machine readable data comprises a bar code label indicative of an inherent photosensitivity of the image recording medium.

4. The image recording apparatus as claimed in claim 1, wherein the correct machine readable data comprises a standardized machine readable data, and wherein the control means comprises means for loading the standardized machine readable data into the memory means as a result of the determination to the failure of reading the machine readable data by the reading means.

5. The image recording apparatus as claimed in claim 4, wherein the machine readable data comprises a bar code label indicative of an inherent photosensitivity of the image recording medium.

6. The image recording apparatus as claimed in claim 5, wherein the means for changing the light irradiation amount comprises a lamp driving circuit connected between the control means and the light source.

7. The image recording apparatus as claimed in claim 6, wherein the means for changing the insertion amount comprises stepper motors connected to filters of the filter unit, and motor drivers connected to the respective stepper motors, the motor drivers being connected to the control means.

8. The image recording apparatus as claimed in claim 7, wherein the reading means comprises a light emitting diode for irradiating light onto the bar code label; a LED driver connected between the LED and the control means; a photo-transistor for receiving a light reflected at the bar code label; and a reading circuit connected between the control means and the photo-transistor.

9. An image recording apparatus for recording an image on an image recording medium, the image recording medium having an elongated configuration and a leading edge portion provided with a machine readable data inherent to the image recording medium, the apparatus comprising;

an exposure unit comprising a light source, a plurality of filters, an exposure portion, means for changing light irradiation amount from the light source, and means for changing insertion amount of filters of the filter unit with respect to an optical path extending from the light source to the exposure portion;

means for reading the machine readable data;

memory means for storing therein a correct machine readable data; and control means connected between the reading means and the memory means for judging whether the reading means fails to read the machine readable data, and for controlling the exposure unit in accordance with the correct machine readable data stored in the memory means, wherein the control means comprises means for loading the correct machine readable data into the memory means, and means for reading from the memory means the correct machine readable data already stored in the memory means if the reading means fails to read a machine readable data on a subsequent image recording medium newly installed, the correct machine readable data being already stored in the memory means in a precedent installation of the image recording medium.

10. The image recording apparatus as claimed in claim 9, wherein the machine readable data comprises a bar code label indicative of an inherent photosensitivity of the image recording medium.

11. An image recording apparatus for recording an image on an image recording medium, the image recording medium having an elongated configuration and a leading edge portion provided with a machine readable data inherent to the image recording medium, the apparatus comprising;

an exposure unit comprising a light source, a plurality of filters, an exposure portion, means for changing a light irradiation amount from the light source, and means for changing insertion amount of filters of the filter unit with respect to an optical path extending from the light source to the exposure portion;

means for reading the machine readable data;

memory means for storing therein a correct machine readable data, wherein the correct machine readable data comprises a standardized machine readable data; and control means connected between the reading means and the memory means for judging whether the reading means fails to read the machine readable data, and for controlling the exposure unit in accordance with the correct machine readable data stored in the memory means, wherein the control means comprises means for loading the standardized machine readable data into the memory means as a result of the determination of the failure of reading the machine readable data by the reading means.

12. The image recording apparatus as claimed in claim 11, wherein the machine readable data comprises a bar code label indicative of an inherent photosensitivity of the image recording medium.

13. The image recording apparatus as claimed in claim 11, wherein the means for changing the light irradiation amount comprises a lamp driving circuit connected between the control means and the light source.

14. The image recording apparatus as claimed in claim 13, wherein the means for changing the insertion amount comprises stepper motors connected to filters of the filter unit, and motor drivers connected to the respective stepper motors, the motor drivers being connected to the control means.

15. The image recording apparatus as claimed in claim 11, wherein the reading means comprises a light emitting diode for irradiating light onto the bar code label; a LED driver connected between the LED and the control means; a photo-transistor for receiving a light reflected at the bar code label; and a reading circuit connected between the control means and the photo-transistor.

* * * * *